(12) United States Patent
Roy

(10) Patent No.: US 6,886,078 B1
(45) Date of Patent: Apr. 26, 2005

(54) SIMULTANEOUS ACCESS AND CACHE LOADING IN A HIERARCHICALLY ORGANIZED MEMORY CIRCUIT

(75) Inventor: Richard S. Roy, Danville, CA (US)

(73) Assignee: Virage Logic Corp., Fremont, CA (US)

( * ) Notice: Subject to any disclaimer, the term of this patent is extended or adjusted under 35 U.S.C. 154(b) by 453 days.

(21) Appl. No.: 09/886,577

(22) Filed: Jun. 21, 2001

(51) Int. Cl.$^7$ .............................................. G06F 12/00

(52) U.S. Cl. ........................ 711/138; 711/119; 711/122

(58) Field of Search ................................. 711/122, 119

(56) References Cited

U.S. PATENT DOCUMENTS 6,675,265 B1 * 1/2004 Barroso et al. ............. 711/141

OTHER PUBLICATIONS

Shimpi, Anand "Intel Pentium III 1GHz", Mar. 8, 2000, http://www.anandtech.com/showdoc.html?i=1191, p. 1–2.*

Handy, "The Cache Memory Book", 2$^{nd}$ edition 1998 Academic Press pp. 43–49 and 89–94.*

* cited by examiner

Primary Examiner—Mano Padmanabhan
Assistant Examiner—Paul Baker
(74) Attorney, Agent, or Firm—Danamraj & Youst, P.C.

(57) ABSTRACT

A hierarchically organized, compilable semiconductor memory circuit having multiple levels with simultaneous access and cache loading. A first level memory portion and at least a next level memory portion are provided as part of the semiconductor memory circuit, wherein the memory portions are associated with separate Data In (DIN) and Data Out (DOUT) buffer blocks for effectuating data operations. DIN buffer blocks of the first level and intermediate levels, if any, are provided with multiplexing circuitry that is selectively actuatable for providing data accessed in the next level memory portion to Local Data In (LDIN) driver circuitry, whereby the accessed data is simultaneously loaded into the first and intermediate levels. Accordingly, extra clock cycles are saved from cache loading of the data used for subsequent memory operations.

17 Claims, 10 Drawing Sheets

SIMULTANEOUS ACCESS AND CACHE LOADING IN A HIERARCHICALLY ORGANIZED MEMORY CIRCUIT

BACKGROUND OF THE INVENTION

1. Technical Field of the Invention

The present invention relates generally to semiconductor memories, and more particularly, to a compilable semiconductor memory architecture which allows simultaneous access and cache loading in a hierarchically organized memory circuit having multiple levels.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that analog blocks, non-volatile memory, random access memories (RAMs), and other "non-logic" cells are being required. The gap in available silicon capacity versus design productivity means that without some fundamental change in methodology, it will take hundreds of staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. Further, successful integration of high speed memory has become a critical feature of today's high performance systems. This is especially true where extremely fast memories are being employed for data caching purposes in attempting to fully harness the superior processor capabilities available nowadays.

Whereas recent advances in the ultra large scale integration of semiconductor devices have made it possible to design cache memories that are satisfactory for some of the typical applications, several deficiencies still exist in the state-of-the-art memory solutions that can be advantageously used with ultra high speed processors. For example, because the memory read/write operations still consume a large number of cycles, data fetches continue to create a bottleneck in the performance. Even where extremely fast cache memories are implemented, data to be cached is read from the slower memories and loaded subsequently into a cache memory portion in discrete, independent write cycles with a delay of several clock periods.

Moreover, these and other deficiencies become compounded where memories are to be implemented in diverse applications (particularly in embedded memory applications) with variable number of I/Os, densities and so on, requiring advanced memory design methodologies such as the re-usable IP products, e.g., memory compilers, described hereinabove.

SUMMARY OF THE INVENTION

Accordingly, the present invention is directed to a hierarchically organized, compilable semiconductor memory circuit having multiple levels with simultaneous access and cache loading, whereby additional clock cycles for data loading operations are advantageously reduced. A first level memory portion and at least a next level memory portion are provided as pitch-matched, compiler-friendly memory portions of the semiconductor memory circuit, wherein the memory portions are associated with separate Data In (DIN) and Data Out (DOUT) buffer blocks for effectuating data operations. DIN buffer blocks of the first level and intermediate levels, if any, are provided with multiplexing circuitry that is selectively actuatable for providing data accessed in the next level memory portion to Local Data In (LDIN) driver circuitry, such that the accessed data is substantially simultaneously loadable into the first and intermediate levels. Accordingly, extra clock cycles are saved from cache loading of the data used for subsequent memory operations.

In a presently preferred exemplary embodiment of the present invention, the various memory portions may be comprised of SRAM, DRAM, and the like. Further, a single DOUT line from the higher level memory portion may be provided where the accessed data appears, wherein the single DOUT line is tied to the multiplexer circuitry in the DIN buffer blocks of the lower levels for effectuating simultaneous data loading.

In another aspect, the present invention is directed to a memory operation method for use in a compilable semiconductor memory circuit having a plurality of hierarchically organized levels. Upon initiating a data access operation for accessing data in the semiconductor memory circuit, a determination is made to verify if the data is available in lower level memory portions (e.g., a first level memory portion) of the semiconductor memory circuit. If the data is not found in the lower levels, the data is accessed in a next level memory portion of the semiconductor memory circuit. Subsequently, pursuant to the data access operation, the accessed data is selectively provided to the lower level memory portions in a substantially simultaneous loading operation effectuated via appropriate multiplexing circuitry disposed in the lower level DIN buffer blocks.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1A:
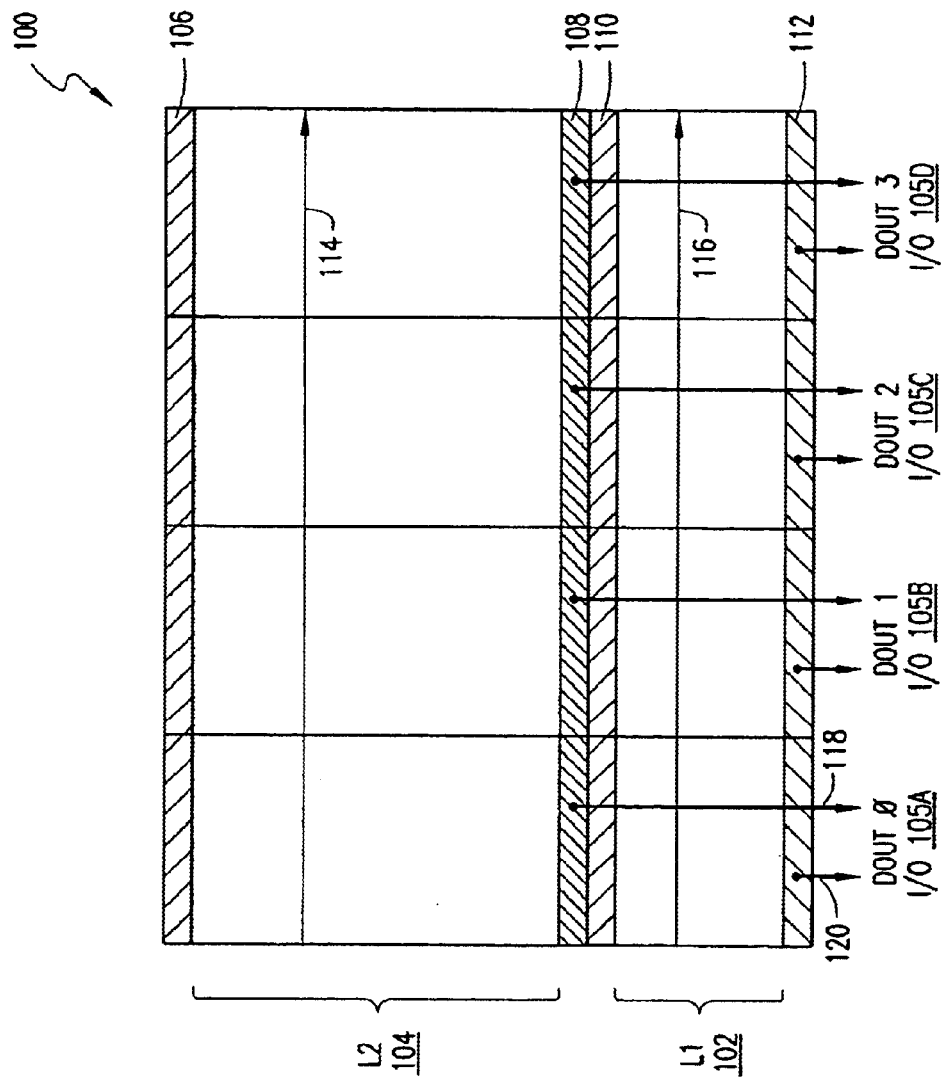
FIGS. 1A and 1B depict a physical architectural view of a hierarchically organized memory circuit illustrated with conventional read and write operations for cache loading of data.

In the drawings, like or similar elements are designated with identical reference numerals throughout the several views thereof, and the various elements depicted are not necessarily drawn to scale. Referring now to FIG. 1A, depicted therein is a physical architectural view of a hierarchically organized semiconductor memory circuit 100 illustrated with a conventional read or memory access operation. The memory circuit 100 is exemplified with two levels of memory: first level or L1 memory portion 102 and second level of L2 memory portion 104; and is shown to comprise a plurality of I/Os, e.g., I/O 105A through I/O 105D. Each memory portion is provided with a Data In (DIN) buffer block and a Data Out (DOUT) buffer block for effectuating data read (i.e., access) and write (i.e., load) operations in conventional manner. For instance, DIN buffer block 106 and DOUT buffer block 108 are exemplified for L2 memory portion 104 of the semiconductor memory circuit 100. Similarly, DIN buffer block 110 and DOUT buffer block 112 are provided with L1 memory portion 102.

As those skilled in the art should readily recognize, L1 and L2 memory portions may be comprised of SRAM or DRAM cells. Typically, L1 memory is provided as a faster cache memory with smaller density, whereas L2 is comprised of a relatively slower, high latency memory occupying a larger area. In one exemplary embodiment, L1 and L2 portions are implemented as high speed SRAM and slower DRAM, respectively.

In the conventional read operation, which will be described in greater detail with reference to a suitable timing diagram in FIG. 2, a wordline (WL) in the memory circuit 100 is selected upon appropriate address decoding and, depending on whether data from L1 or L2 is to be accessed, corresponding DOUT circuitry is activated to generate a DOUT signal on the selected I/O. With respect to L2 memory portion 104, WL 114 is exemplified. Similarly, WL 116 is exemplified for L1 memory portion 102. Upon employing suitable sense amp techniques, which are well known in the memory design art, data accessed in L2 memory appears on a selected DOUT, e.g., DOUT-0 118, for I/O 105A. In similar fashion, data accessed in L1 memory appears on DOUT-0 120 for I/O 105A. It should be appreciated by those skilled in the art upon reference hereto that although separate DOUT lines are exemplified with respect to the DOUT buffer blocks associated with L1 and L2 memory portions, a single DOUT line that is appropriately tied in the DOUT blocks may also be provided for carrying data from both L1 and L2 portions.

Figure 1B:
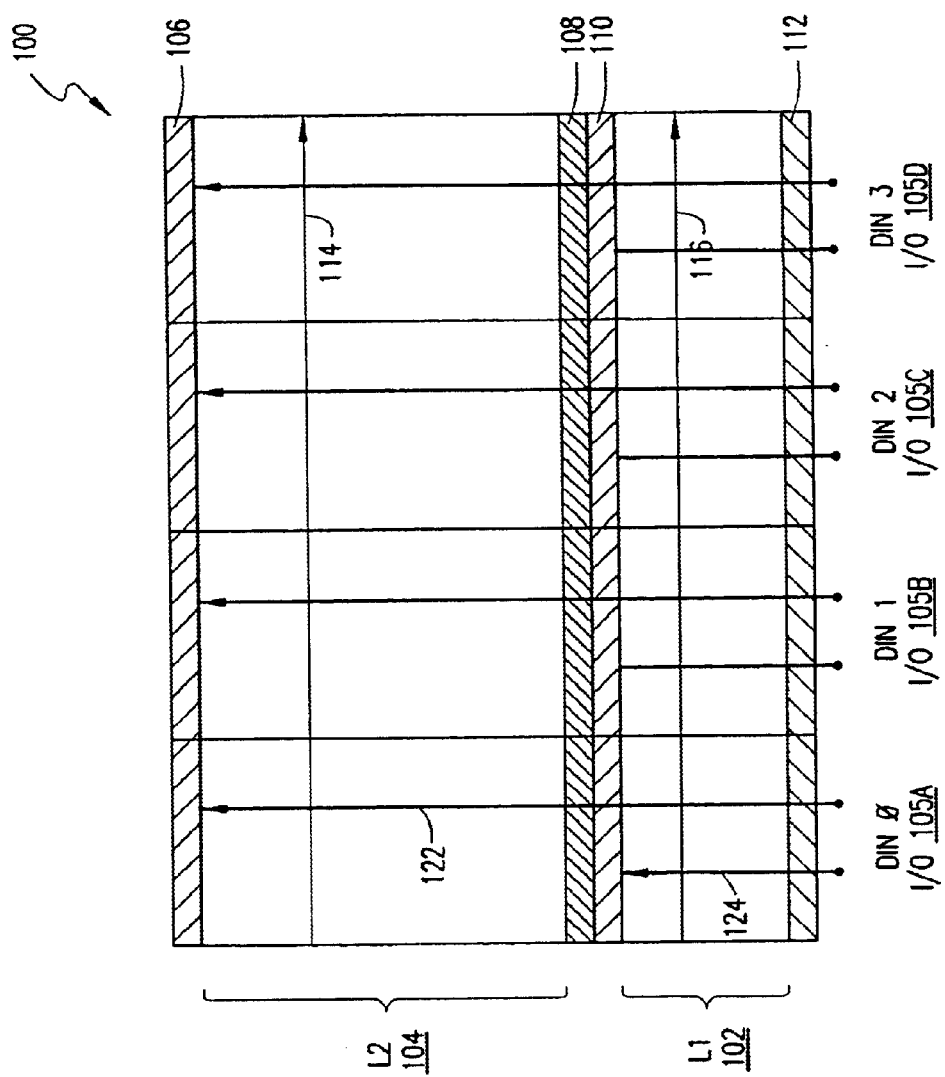

FIG. 1B depicts the semiconductor memory circuit 100 described in the foregoing, wherein a conventional write (i.e., data load) operation is illustrated. Data is presented to the appropriate memory portions via the DIN circuitry. Based on the selected WL, a plurality of memory locations in L1 or L2 portions are activated for data storage. Similar to the DOUT signals, either separate DIN lines (e.g, DIN-0 122 and DIN-0 124 for I/O 105A) or a single DIN line may be provided for inputting the data for selected I/Os. DIN buffer blocks 106 and 110 are operable to receive the data present on the DIN lines with respect to L2 and L1 memory portions, respectively. Appropriate Local Data In (LDIN) driver circuits are provided (not shown in FIG. 1B) for effectuating the write operation for the selected WL. Accordingly, when the L1 memory portion 102 is utilized as a high speed memory cache for an external processor with which the memory circuit is interfaced, the data accessed from the L2 portion 104 may be cached into the L1 portion by means of separate load operations via DIN lines in order to facilitate subsequent data fetch operations from the processor.

Figure 2:
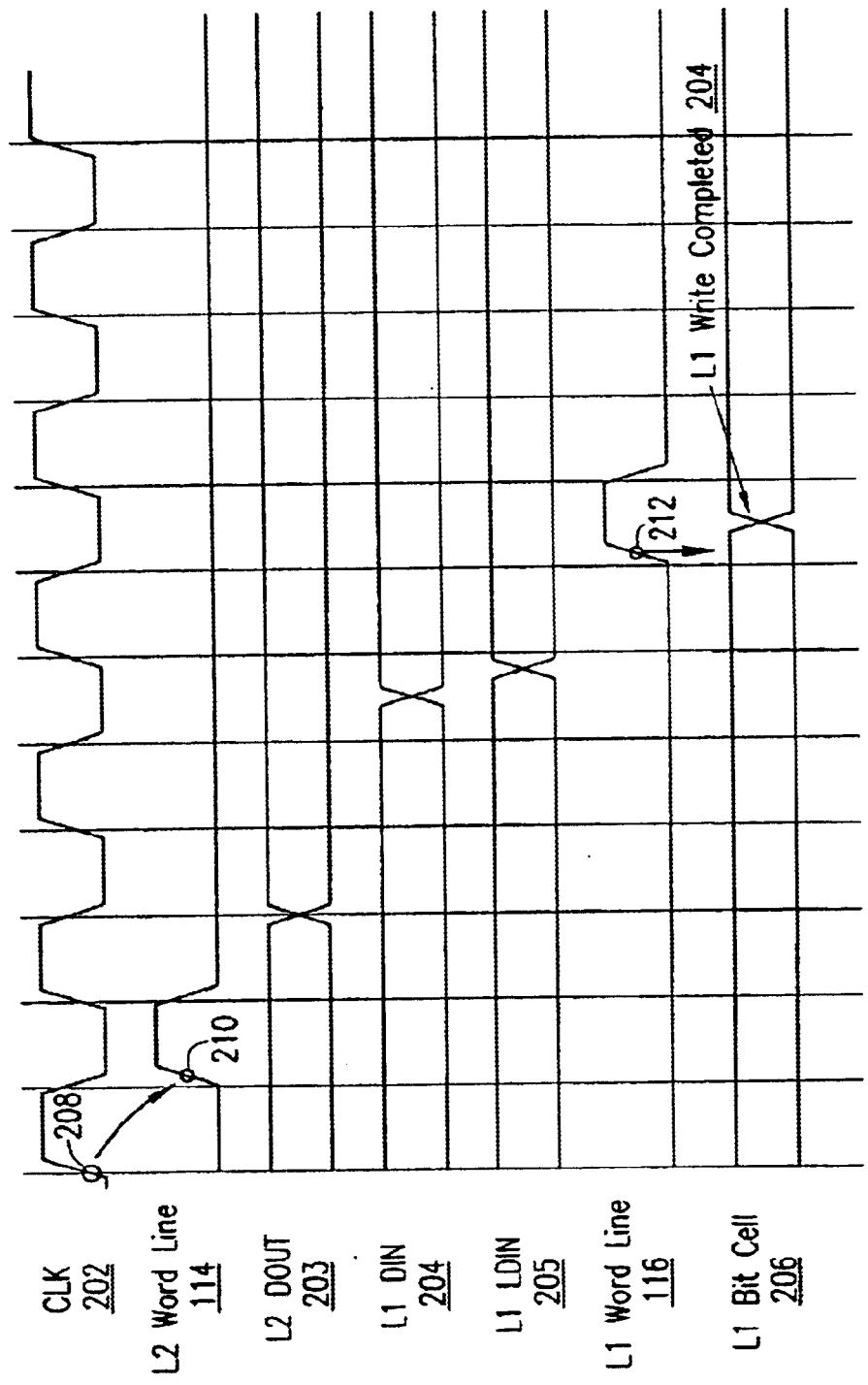
FIG. 2 is a timing diagram for a conventional read and cache load operation with respect to the memory circuit depicted in FIGS. 1A and 1B.

Referring now to FIG. 2, depicted therein is a timing diagram for the conventional read and cache load operations described hereinabove. Upon asserting a clock (CLK) signal 202, as indicated by a rising edge 208 therein, WL 114 selected in the L2 memory portion 104 goes high (rising edge 210) for a read operation. Thereafter, sensed data appears on L2 DOUT lines 203 which is provided to external circuitry. After a few clock cycles, the data is provided on L1 DIN lines 204 for cache loading into the L1 memory portion 102. The LDIN driver circuitry provided with the DIN buffer block 110 of the L1 memory portion 102 drives appropriate LDIN signals 205 to the L1 memory portion 102. Based on appropriate write address decoding, WL 116 is selected (rising edge 212) in L1 after additional clock cycles that identifies a plurality of bit cells (reference numeral 206) to which the data is be written. Thereafter, the L1 write operation with respect to the selected bit cells 206 is completed as indicated by reference numeral 214.

As pointed out in the Background section of the present patent application, it should be apparent based on the foregoing that several clock cycles are expended before the data to be cached in L1 is provided as a separate load operation on its DIN and LDIN lines, thereby degrading the overall performance of the memory circuit 100.

Figure 3:
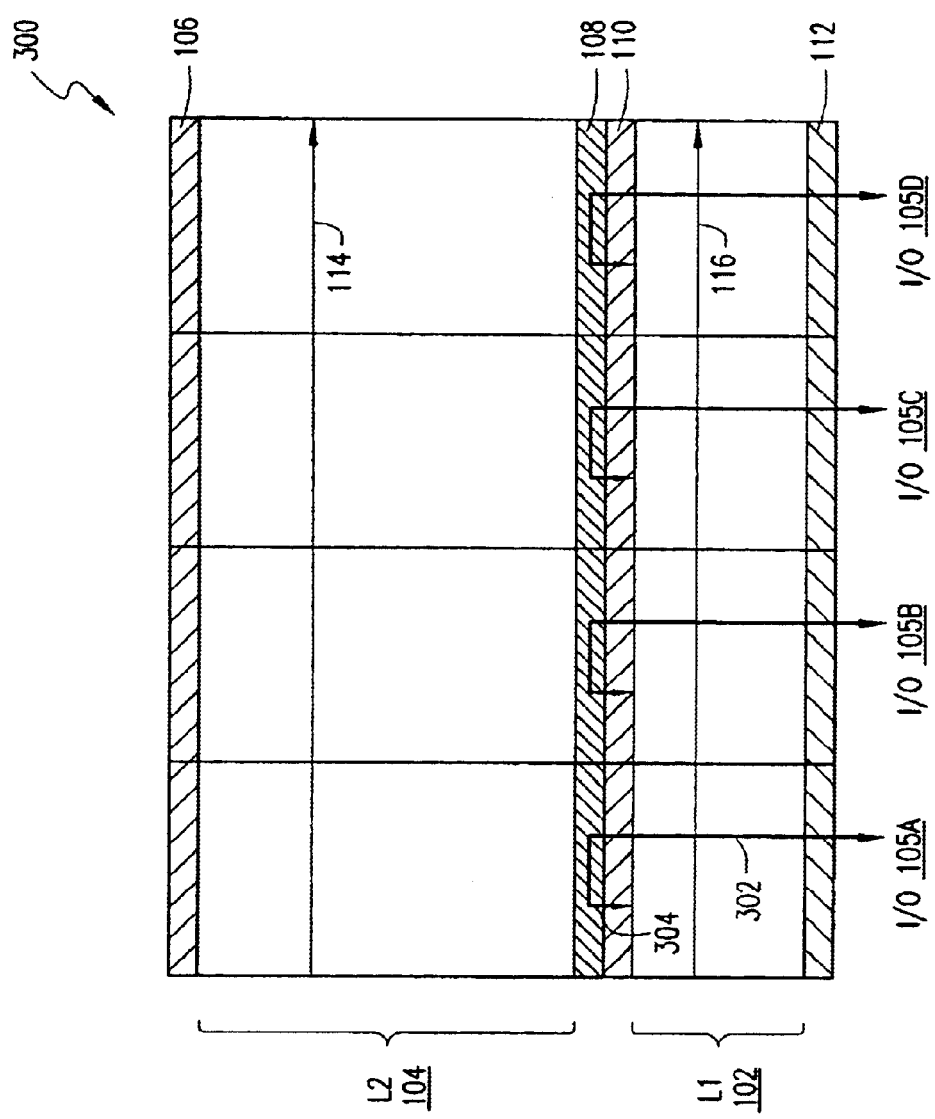
FIG. 3 depicts a physical architectural view of a hierarchically organized memory circuit illustrated with exemplary simultaneous access and cache load operations in accordance with the teachings of the present invention.

FIG. 3 depicts a physical architectural view of an exemplary embodiment of a hierarchically organized memory circuit 300 provided in accordance with the teachings of the present invention for carrying out simultaneous access and cache load operations. For the sake of consistency with hereinabove, the memory circuit 300 is exemplified herein with the same two levels of memory portions: L2 memory portion 104 and L1 memory portion 102, each having DIN and DOUT buffer blocks 106, 108 and 110, 112, respectively. Again, four I/Os—I/O 105A through I/O 105D—are illustrated.

In accordance with the teachings of the present invention, when a higher level memory portion is accessed, data appearing on the corresponding DOUT is provided as an input to the DIN buffer blocks of the lower level memory portions such that the DIN buffer blocks can selectively effectuate substantially simultaneous load operations into respective memory portions. It should be appreciated that by effectuating such loading operations, additional cycles for data caching are advantageously reduced, thereby improving the overall memory performance.

Continuing to refer to FIG. 3, the L1 and L2 portions are preferably comprised of a pitch-matched memory cell architecture regardless of the constituent cell type in order to facilitate compilability of the memory circuit 300 such that a variable number of I/Os can be scalably accommodated to suit different applications. In the exemplary embodiment depicted, each DOUT line driven by L2 DOUT buffer block 108 is tied to the DIN buffer block 110 of L1 memory 102 on a per I/O basis for providing the accessed data as input for cache loading operations. For instance, data appearing on DOUT 302 of I/O 105A is provided to the DIN buffer block 110 via signal path 304. As will be set forth hereinbelow, the DOUT signal path provided to the DIN buffer block is multiplexed with the standard DIN input path such that under suitable control signals the data appearing on the DOUT signal path is provided to the LDIN driver circuitry of the DIN buffer block for effectuating the write operation to the selected memory locations.

Figure 4:
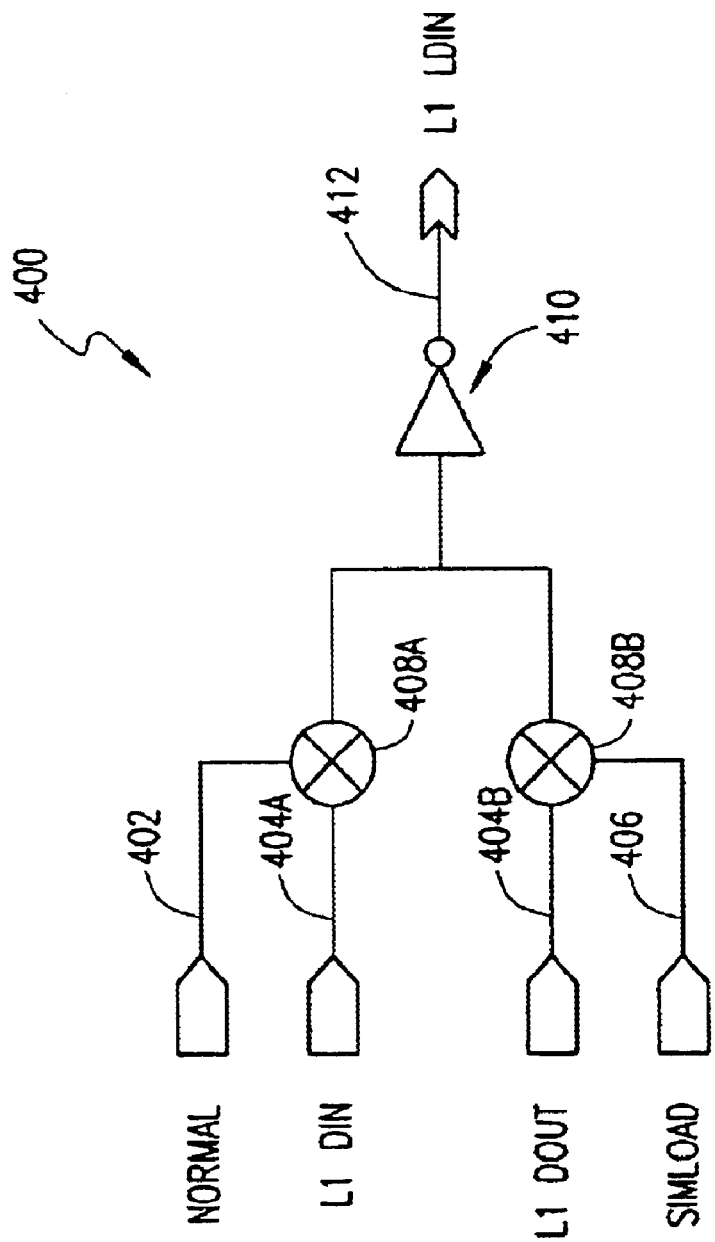
FIG. 4 depicts exemplary multiplexing circuitry for simultaneously loading accessed data into a lower level memory portion.

FIG. 4 depicts a simplified, high level embodiment of exemplary multiplexing circuitry 400 usable in individual L1 DIN buffers for simultaneously loading accessed data (from L2) into L1 memory locations. Multiplexing circuitry 400 is comprised of one or more multiplexers (e.g., mux 408A and mux 408B) collectively operable to select either L1 DIN 404A or L2 DOUT 404B for providing as input under selectively activated control signals, NORMAL 402 and SIMLOAD 406, preferably generated by external logic or processor circuitry. The output from the muxes is provided to an inverter driver 410 to provide L1 LDIN signal 412 for effectuating the write operation. When NORMAL 402 is asserted, externally supplied data appearing on L1 DIN 404A is provided as the input and, in similar fashion, when SIMLOAD 406 is asserted, accessed data appearing on L2 DOUT 404B is provided as the input.

Figure 5:
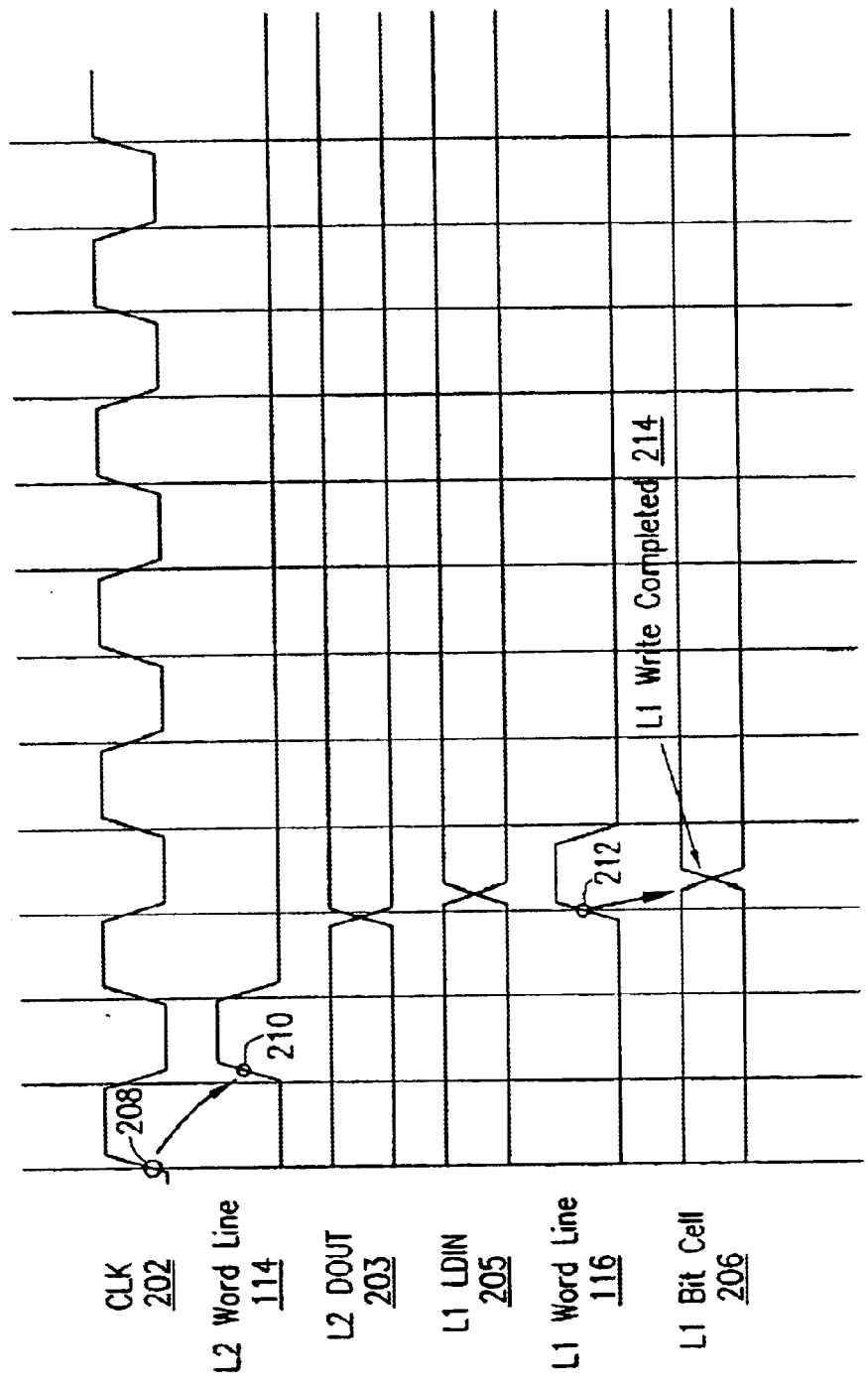
FIG. 5 depicts a timing diagram for an exemplary simultaneous access and cache load operation with reference to the memory circuit depicted in FIG. 3.

Referring now to FIG. 5, depicted therein is a timing diagram for an exemplary simultaneous access and cache load operation with reference to the memory circuit depicted in FIG. 3. Upon asserting the CLK signal 202 (rising edge 208), L2 is accessed when decoded WL 114 is driven high (rising edge 210). Thereafter, accessed data appears on L2 DOUT lines 203 similar to the conventional read operation. Because of the multiplexing circuitry provided in L1DIN buffer block, the accessed data on L2 DOUT lines is provided as load input to L1 LDIN lines 205 by asserting SIMLOAD control signal (not shown in this FIG.). The L1 WL 116 is driven high (rising edge 212) for the selected bit cells. Subsequently, the L1 write operation with respect to the selected bit cells 206 is completed within a few clock cycles as indicated by reference numeral 214.

It should be appreciated that because the L2 DOUT data is readily available as data input for cache loading, additional cycles necessary for generating normal DIN data are advantageously eliminated. Further, the cache address for the loading operation in L1 memory portion may be provided to be the same as, or dependent upon, the address within the L2 memory portion. For example, a select portion of the row address bits (lower order address bits) may be shared among the various memory portions. In other exemplary embodiments, however, an address logic block external to the memory circuit may be provided for computing the cache address based on more sophisticated algorithms.

Figure 6A:
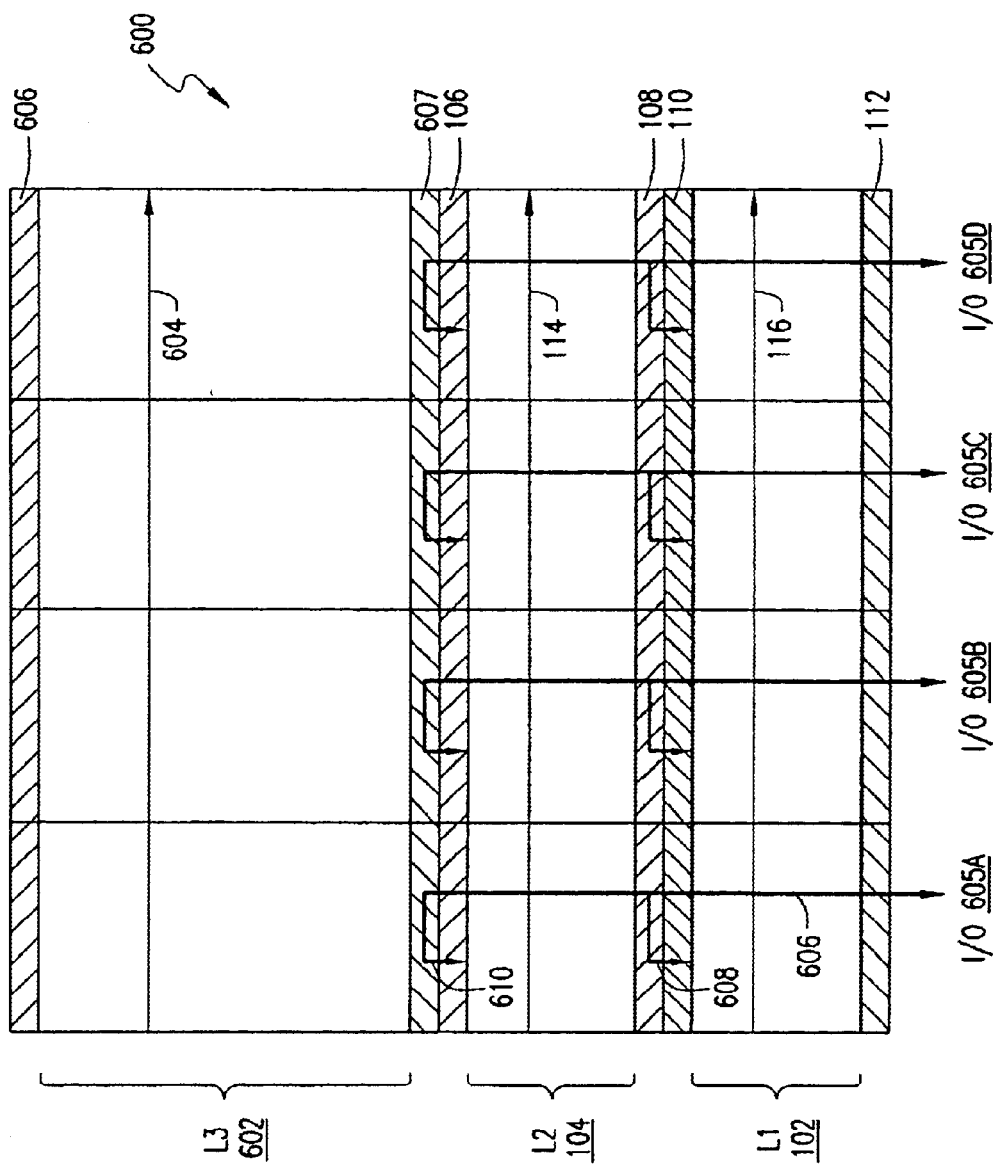
FIGS. 6A and 6B depict exemplary embodiments of a three-level memory circuit illustrated with exemplary simultaneous access and cache load operations in accordance with the teachings of the present invention.
Figure 6B:
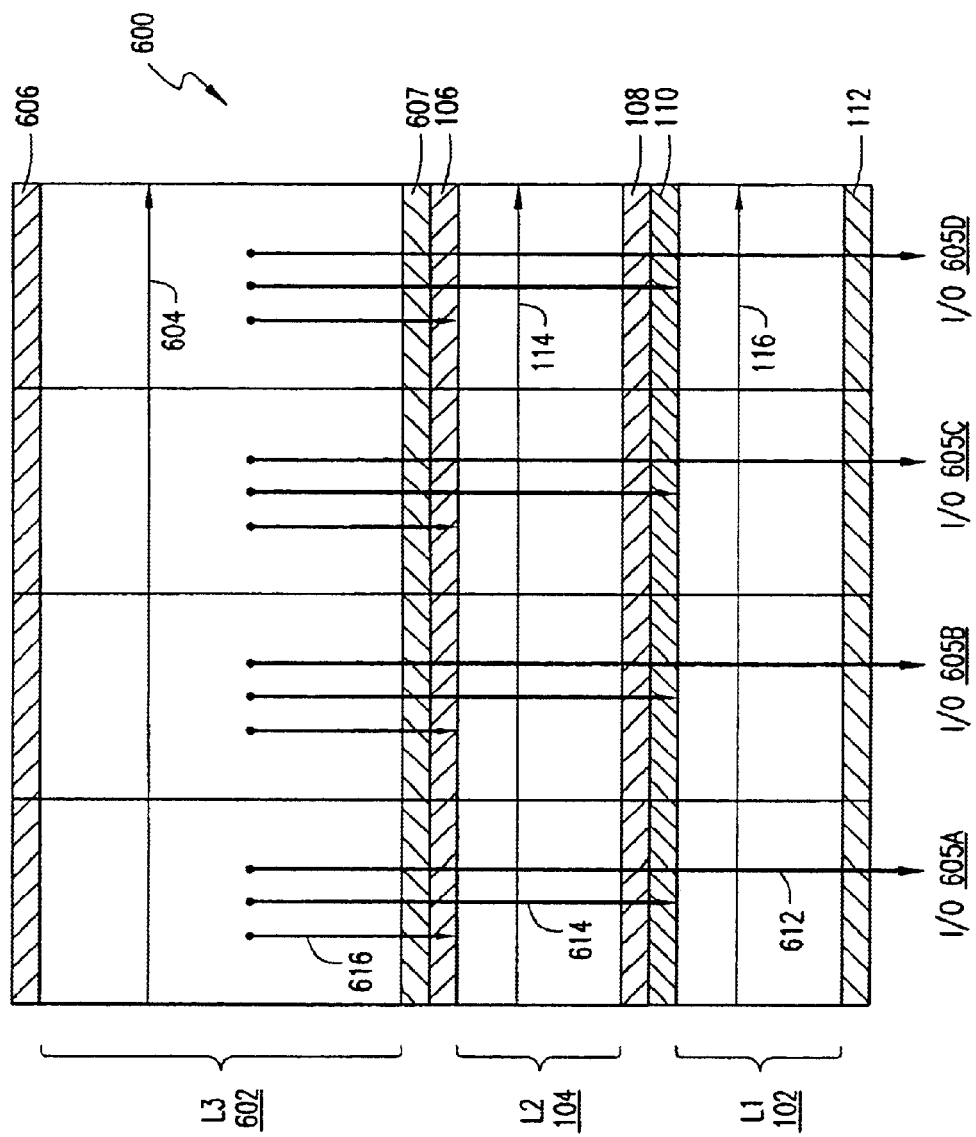

FIGS. 6A and 6B depict two exemplary embodiments of a three-level memory circuit 600 capable of effectuating simultaneous access and cache loading in accordance with the teachings of the present invention. An L3 memory portion 602 is provided in the memory circuit 600 in addition to the L1 and L2 portions 102, 104 described hereinabove. DIN and DOUT buffer blocks 606 and 607 are correspondingly provided with respect to the L3 memory portion for effectuating data operations, wherein four I/Os (I/O 605A through 605D) are illustratively provided. A selected WL 604 is exemplified in the L3 memory.

In accordance with the teachings of the present invention, the L3 DOUT paths shown in FIG. 6A are tied to the lower level DIN buffer blocks on a per I/O basis in order to effectuate simultaneous cache loading operations. L3 DOUT signal paths may be multiplexed with L2 DIN, L1 DIN inputs in any suitable combination (such that cache loading can be effectuated in the lower level memory portions in a predetermined fashion, e.g., L3 data may be cached into both L1 and L2 portions, or only a selected memory portion, et cetera). Reference numeral 606 exemplifies the L3 DOUT path for I/O 605A and reference numerals 608 and 610 exemplifies L3 DOUT input paths to DIN buffer blocks 110 and 106 associated with L1 and L2 portions, respectively. It should be readily recognized that each of the DIN blocks 106 and 110 is provided with the multiplexing circuitry (similar to the circuitry 400 exemplified in the foregoing with respect to FIG. 4) for multiplexing L2 DOUT with L1 DIN and L2 DIN appropriately.

In the exemplary embodiment depicted in FIG. 6B, separate L3 DOUT signal paths are provided per I/O for coupling with the lower level DIN buffer blocks. For example, as illustrated for I/O 605A, a global DOUT path 612 is provided for outputting data from L3 602. Reference numerals 614 and 616 refer to separate L3 DOUT segments that terminate to DIN buffer blocks 110 and 106, respectively.

Figure 7:
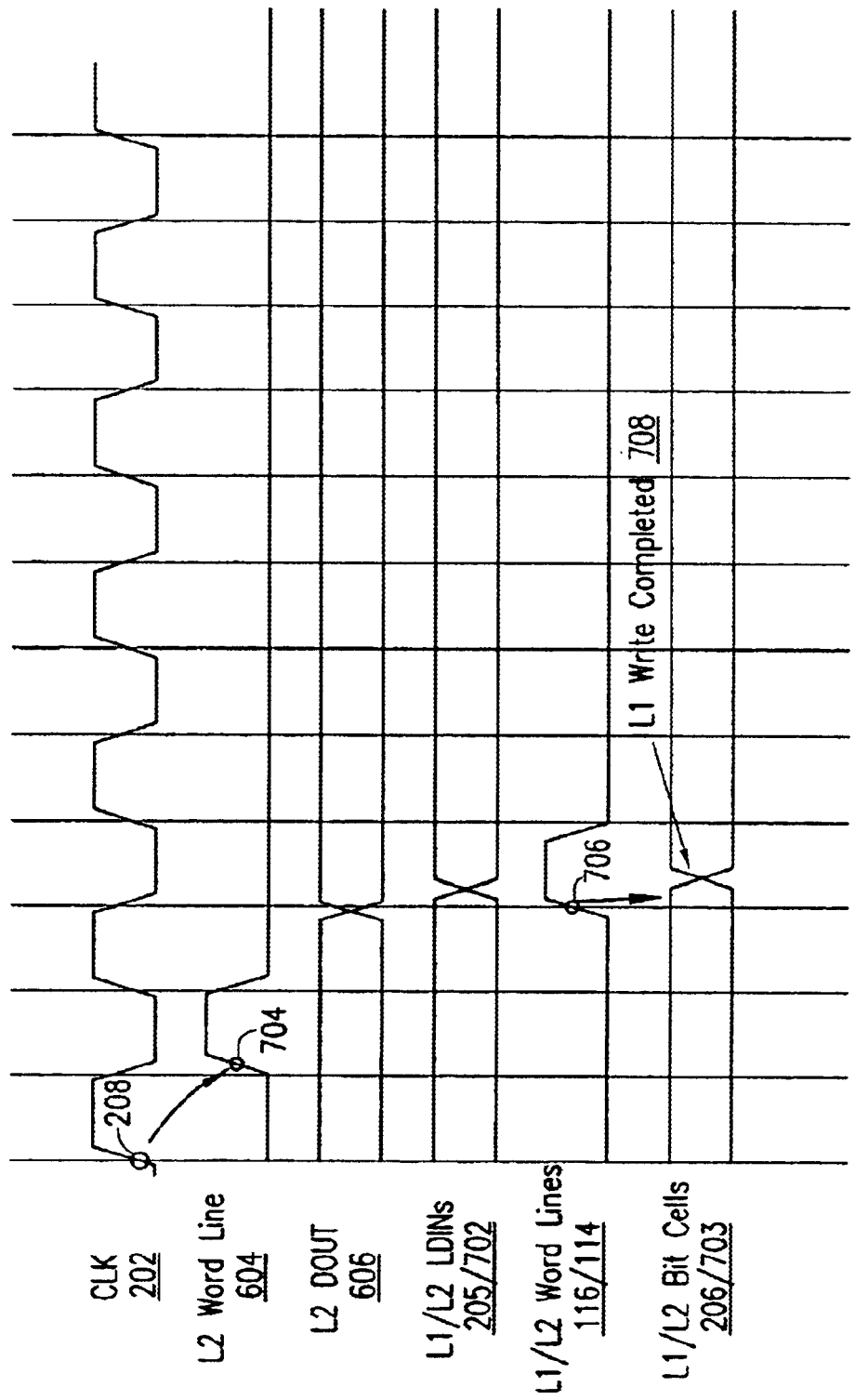
FIG. 7 depicts a timing diagram for an exemplary simultaneous access and cache load operation with respect to the memory circuit depicted in FIGS. 6A and 6B.

FIG. 7 depicts a timing diagram for an exemplary simultaneous access and cache load operation with respect to the memory circuit 600 shown in FIGS. 6A and 6B, wherein L3 data is cached into both L1 and L2 memory portions. Upon asserting CLK 202 (rising edge 208), the selected WL 604 in L3 memory portion is driven high (rising edge 704) for effectuating the access operation. Thereafter, the accessed data appears on L3 DOUT lines 606, which is provided as muxed input to L1 and L2 LDIN driver circuitry. Accordingly, L1 and L2 LDIN signals 205 and 702 are driven to appropriate levels indicative of the L3 DOUT data. Selected WLs 116/114 in the L1 and L2 portions are driven high (rising edge 706) in order to facilitate the respective write operations. Subsequently, the L1/L2 write operations with respect to the selected bit cells 206/703 are completed within a few clock cycles as indicated by reference numeral 708.

Figure 8:
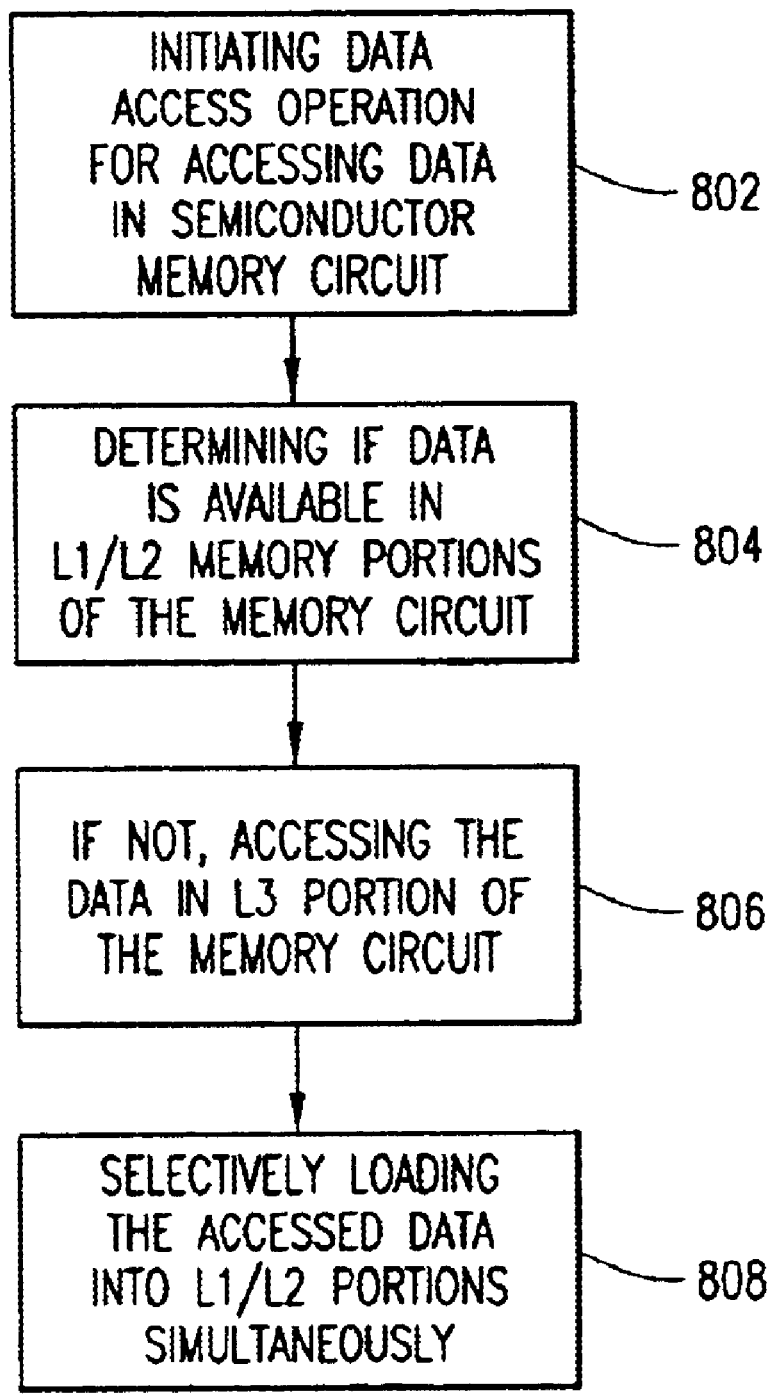
FIG. 8 is a flow chart which illustrates the steps involved in an exemplary memory operation method for use in a hierarchically organized memory circuit capable of simultaneous access and cache load operations in accordance with the teachings of the present invention.

Referring now to FIG. 8, shown therein is a flow chart which illustrates the steps involved in an exemplary memory operation method for use in conjunction with a hierarchically organized memory circuit capable of simultaneous access and cache loading operations in accordance with the teachings of the present invention. Upon initiating a data access operation for accessing data in the semiconductor memory circuit (step 802), a determination is made if the data is available in the lower level memory portions (e.g., first or second levels, L1 and L2) of the memory circuit (decision step 804). Once a miss on L1 and L2 has been determined, that is, if the data to be accessed is not available in the lower portions, that data is accessed in the higher level memory portion, i.e., L3 portion (step 806). Subsequent clock cycles are kept open for selectively loading the accessed data into L1 and/or L2 memory portions in a substantially simultaneous cache loading operation (step 808).

Based on the foregoing, it should be appreciated that the present invention provides a simultaneous access and cache loading scheme for use with a hierarchically organized memory circuit which advantageously reduces the clock cycles which have been necessary heretofore in the existing art. Moreover, the present invention is of particular benefit with respect to scalable memory compilers, thereby providing the simultaneous access and cache loading scheme in a variety of memory applications.

Additionally, it is believed that the operation and construction of the present invention will be apparent from the foregoing Detailed Description. While the method and circuitry shown and described have been characterized as being preferred, it should be readily understood that various changes and modifications could be made therein without departing from the scope of the present invention as set forth in the following claims.

What is claimed is:

1. A compilable semiconductor memory circuit having a plurality of hierarchically organized levels, comprising:

a first level memory portion for storing data therein, said first level memory portion having first level Data In (DIN) and Data Out (DOUT) buffer blocks associated therewith for effectuating data operations with respect to a location in said first level memory portion, said first level DIN buffer block including Local Data In (LDIN) driver circuitry;

a second level memory portion for storing data therein, said second level memory portion having second level Data In (DIN) and Data Out (DOUT) buffer blocks associated therewith for effectuating data operations with respect to a location in said second level memory portion;

multiplexing circuitry disposed in said first level DIN buffer block, said multiplexing circuitry being actuatable for providing data accessed through said second level DOUT buffer block to said LDIN driver circuitry in said first level DIN buffer block, whereby data accessed from said second level memory portion is selectively loaded into said first level memory portion in a loading operation that is substantially simultaneous relative to accessing of said data in said second level memory portion;

a third level memory portion for storing data therein, said third level memory portion having third level Data In (DIN) and Data Out (DOUT) buffer blocks associated therewith for effectuating data operations with respect to a location in said third level memory portion; and multiplexing circuitry disposed in said second level DIN buffer block, said multiplexing circuitry being actuatable for providing data accessed through said third level DOUT buffer block to LDIN driver circuitry provided in said second level DIN buffer block, who whereby data accesses from said third level memory portion is selectively loaded into said second level memory portion in a loading operation that is substantially simultaneous relative to accessing of said data in said third level memory portion, wherein said multiplexing circuitry disposed in said first level DIN buffer block is selectively operable for providing said data accessed through said third level DOUT buffer block to said LDIN driver circuitry in said first level DIN buffer block for substantially simultaneously loading said data into said first level memory portion.

2. The compilable semiconductor memory circuit having a plurality of hierarchically organized levels as set forth in claim 1, wherein said first and second level memory portions comprise static random access memory (SRAM).

3. The compilable semiconductor memory circuit having a plurality of hierarchically organized levels as set forth in claim 1, wherein said first level memory portion comprises SRAM and said second level memory portion comprises dynamic RAM (DRAM).

4. The compilable semiconductor memory circuit having a plurality of hierarchically organized levels as set forth in claim 1, wherein each of said first, second, and third level memory portions is selected from the group consisting of SRAM and DRAM.

5. The compilable semiconductor memory circuit having a plurality of hierarchically organized levels as set forth in claim 4, wherein said loading operation into said first level memory portion is effectuated using an address calculated by a separate address logic circuit.

6. The compilable semiconductor memory circuit having a plurality of hierarchically organized levels as set forth in claim 4, wherein said loading operation into said first level memory portion is effectuated using an address that is dependent on an address used for accessing data in one of said second and third level memory portions.

7. The compilable semiconductor memory circuit having a plurality of hierarchically organized levels as set forth in claim 4, wherein said loading operation into said second level memory portion is effectuated using an address calculated by a separate address logic circuit.

8. The compilable semiconductor memory circuit having a plurality of hierarchically organized levels as set forth in claim 4, wherein said loading operation into said second level memory portion is effectuated using an address that is dependent on an address used for accessing data in said third level memory portion.

9. A memory operation method for use in a compilable semiconductor memory circuit having a plurality of hierarchically organized levels, comprising the steps of:

initiating a data access operation for accessing data in said semiconductor memory circuit;

determining if said data is available in a first level memory portion of said semiconductor memory circuit;

if not, accessing said data in a next level memory portion integrated within said semiconductor memory circuit; and selectively loading said data accessed from said next level memory portion into said first level memory portion in a loading operation that is substantially simultaneous relative to said accessing of said data in said next level memory portion, wherein said loading operation into said first level memory portion is effectuated using an address calculated by a separate address logic circuit.

10. The memory operation method for use in a compilable semiconductor memory circuit as set forth in claim 9, wherein said next level memory portion is a second level memory portion of said semiconductor memory circuit.

11. The memory operation method for use in a compilable semiconductor memory circuit as set forth in claim 9, wherein said next level memory portion is a third level memory portion of said semiconductor memory circuit.

12. The memory operation method for use in a compilable semiconductor memory circuit as set forth in claim 9, wherein said loading operation into said first level memory portion is effectuated using an address that is dependent on an address used for accessing data in said next level memory portion.

13. The memory operation method for use in a compilable semiconductor memory circuit as set forth in claim 9, wherein said first level memory portion is comprised of static random access memory (SRAM).

14. The memory operation method for use in a compilable semiconductor memory circuit as set forth in claim 9, wherein said first level memory portion is comprised of dynamic RAM (DRAM).

15. The memory operation method for use in a compilable semiconductor memory circuit as set forth in claim 9, wherein said next level memory portion is comprised of DRAM.

16. The memory operation method for use in a compilable semiconductor memory circuit as set forth in claim 9, wherein said next level memory portion is comprised of SRAM.

17. The memory operation method for use in a compilable semiconductor memory circuit as set forth in claim 9, wherein each of said first and second level memory portions is selected from the group consisting of SRAM and DRAM.

* * * * *